United States Patent
Musciano et al.

(10) Patent No.: US 7,679,920 B2
(45) Date of Patent: Mar. 16, 2010

(54) COOLING AIR DISTRIBUTION SCHEME FOR COMMUNICATION BOARDS

(75) Inventors: Michael Joseph Musciano, San Clemente, CA (US); Douglas Ronald Daniels, Lake Forest, CA (US); Nasser Barabi, Lafayette, CA (US)

(73) Assignee: Solarflare Communications, Inc., Irvine, CA (US)

( * ) Notice: Subject to any disclaimer, the term of this patent is extended or adjusted under 35 U.S.C. 154(b) by 0 days.

(21) Appl. No.: 12/151,792

(22) Filed: May 9, 2008

(65) Prior Publication Data

US 2009/0279252 A1 Nov. 12, 2009

(51) Int. Cl.
*H05K 7/20* (2006.01)
*H05K 5/00* (2006.01)

(52) U.S. Cl. ............... 361/721; 361/679.48; 361/679.5; 361/692; 361/694; 361/695; 361/720; 174/16.1; 174/547; 454/184

(58) Field of Classification Search ............ 361/679.46, 361/679.48–679.51, 690, 692, 694–695, 361/720–721, 748, 752, 760; 174/16.1, 250, 174/252, 260, 547–548; 454/184
See application file for complete search history.

(56) References Cited

U.S. PATENT DOCUMENTS

| | | | |
|---|---|---|---|
| 3,184,069 A | 5/1965 | Rosenberg | |
| 3,486,076 A | 12/1969 | Abbott et al. | |
| 3,992,653 A | 11/1976 | Richardson et al. | |
| 4,716,499 A | 12/1987 | Bhargava | |
| 4,837,663 A | 6/1989 | Zushi et al. | |
| 4,862,320 A | 8/1989 | Schmidt et al. | |
| 5,057,968 A | 10/1991 | Morrison | |
| 5,196,989 A | 3/1993 | Zsolnay | |
| 6,027,535 A * | 2/2000 | Eberle et al. | 361/690 |
| 6,198,629 B1 * | 3/2001 | Cannon et al. | 361/695 |
| 6,512,672 B1 | 1/2003 | Chen | |
| 6,595,783 B1 * | 7/2003 | Steinman et al. | 439/65 |
| 6,625,019 B1 * | 9/2003 | Steinman et al. | 361/695 |
| 6,625,033 B1 * | 9/2003 | Steinman | 361/753 |
| 6,625,035 B1 * | 9/2003 | Steinman et al. | 361/759 |
| 6,930,890 B1 | 8/2005 | Branscomb | |
| 6,987,673 B1 | 1/2006 | French et al. | |
| 7,167,380 B2 * | 1/2007 | Ice | 361/796 |
| 7,210,586 B2 * | 5/2007 | Ice | 211/26 |
| 7,277,296 B2 * | 10/2007 | Ice | 361/756 |
| 7,450,377 B2 * | 11/2008 | Matsumoto et al. | 361/679.48 |
| 7,554,815 B2 * | 6/2009 | Hardt et al. | 361/753 |
| 7,606,044 B2 * | 10/2009 | Bailey et al. | 361/752 |

FOREIGN PATENT DOCUMENTS

JP 2004128192 4/2004

* cited by examiner

*Primary Examiner*—Jayprakash N Gandhi
*Assistant Examiner*—Robert J Hoffberg
(74) *Attorney, Agent, or Firm*—Weide & Miller, Ltd.

(57) ABSTRACT

A cooling distribution configuration is provided for chassis-mounted electronics boards. In one embodiment, the chassis comprises a housing and at least one electronics board. The electronics board may comprise a communication board having a plurality of ports. Cooling air spaces are defined above and below the board, permitting cooling air to be drawn over both sides of the board. Notches extend inwardly from an edge of the board, the notches serving as air flow paths between the cooling air spaces and serving to distribute cooling air flowing into the housing from one or more intakes to the cooling air spaces.

14 Claims, 6 Drawing Sheets

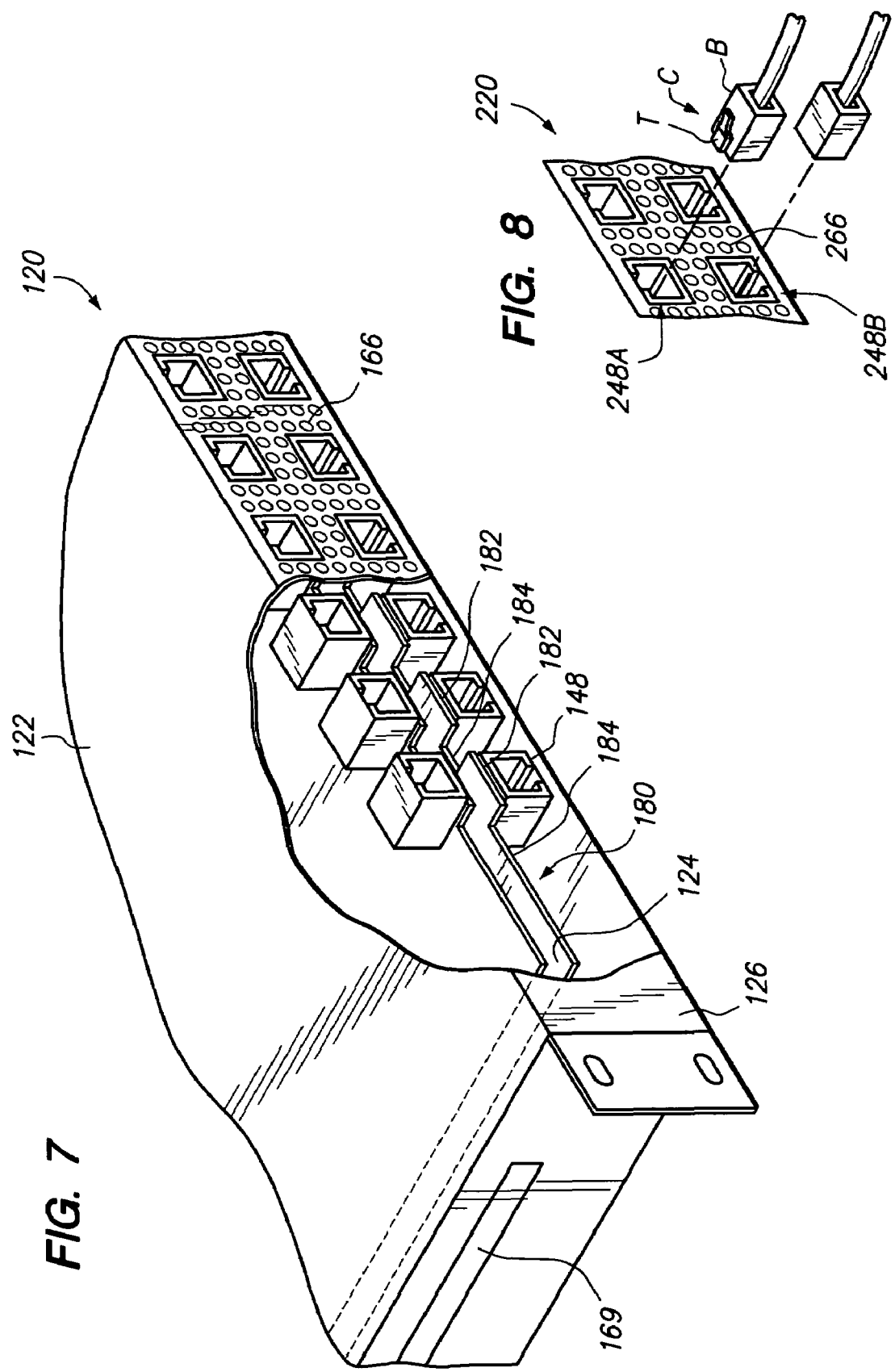

COOLING AIR DISTRIBUTION SCHEME FOR COMMUNICATION BOARDS

FIELD OF THE INVENTION

The present invention relates to configurations for circuit boards, housings, and in particular for configurations for cooling and efficient space utilization for circuit boards and housings.

BACKGROUND OF THE INVENTION

Various electronic equipment is utilized to provide data connections between components and to process data. This equipment may comprise a communication board having a substrate bearing a number of connectors, data processing components (filters, converters, processors and the like) and associated connecting circuitry. The connectors may be of a variety of types and permit cable connection to the board.

These communication boards may be mounted in a housing or chassis for protection and support. Unfortunately, this same mounting increases the likelihood of overheating of the board and makes the various components of the board, including the connectors, less accessible. In addition, in many situations, these chassis are mounted in a rack in a stacked configuration. This allows a large amount of equipment to be located in a small area. However, the close proximity of the equipment makes even more difficult the task of cooling the boards.

Various solutions have been attempted to solve these problems. For example, fans may be employed in an attempt to circulate air to cool the board, or air conditioners may be used to cool the air around the board. These solutions are not sufficiently effective, however, in situations such as those described above.

SUMMARY OF THE INVENTION

One aspect of the invention is a cooling air distribution scheme for one or more chassis-mounted electronics boards. In one embodiment, the chassis comprises a housing and at least one electronics board. The electronics board may comprise a communication board having a plurality of ports.

In one embodiment, the electronics board is located in the housing with an air cooling space above and below it. The electronics board has at least one edge having a number of inwardly extending notches. The notches define air flow paths between the first and second air cooling spaces, the notches serving to distribute cooling air flowing through one or more cooling air intakes to the cooling air spaces.

The notches in the electronics board may be located between the ports.

In one embodiment, one or more cooling air intakes are located at front of housing. The notches may be located in a front edge of the electronics board with the front edge of the board located at the front of the housing, adjacent to the cooling air intakes.

In other embodiments, more than one electronics board may be located in the housing. In that event, each electronics board preferably has one or more notches. The area of the notches in the first and second electronics boards may vary, such as for tuning the distribution of air to the various cooling air spaces above and below (and between) the boards.

In one embodiment, one or more air handling devices such as blowers are utilized to draw air through the housing. Primary vents are provided in a front of the housing and one or more exhaust vent are provided at a rear of the housing.

The chassis may include other components. In one embodiment, one or more power supplies are located in the housing. One or more side or other secondary vents may be utilized to supplement air flow to a cooling system of each power supply. The air through these secondary vents may be at least partially divided by one or more baffles from the primary air flows for cooling the boards.

Further objects, features, and advantages of the present invention over the prior art will become apparent from the detailed description of the drawings which follows, when considered with the attached figures.

DESCRIPTION OF THE DRAWINGS

FIG. 7 is an enlarged view of a chassis and associated communication boards in accordance with another embodiment of the invention; and FIG. 8 illustrates a connector configuration of the chassis and communication boards illustrated in FIG. 7 in greater detail.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

One embodiment of the invention is a configuration of a chassis including one or more communication boards. One aspect of the invention is a cooling configuration for the boards. Yet another aspect of the invention is a configuration of data ports of the boards.

Figure 1:
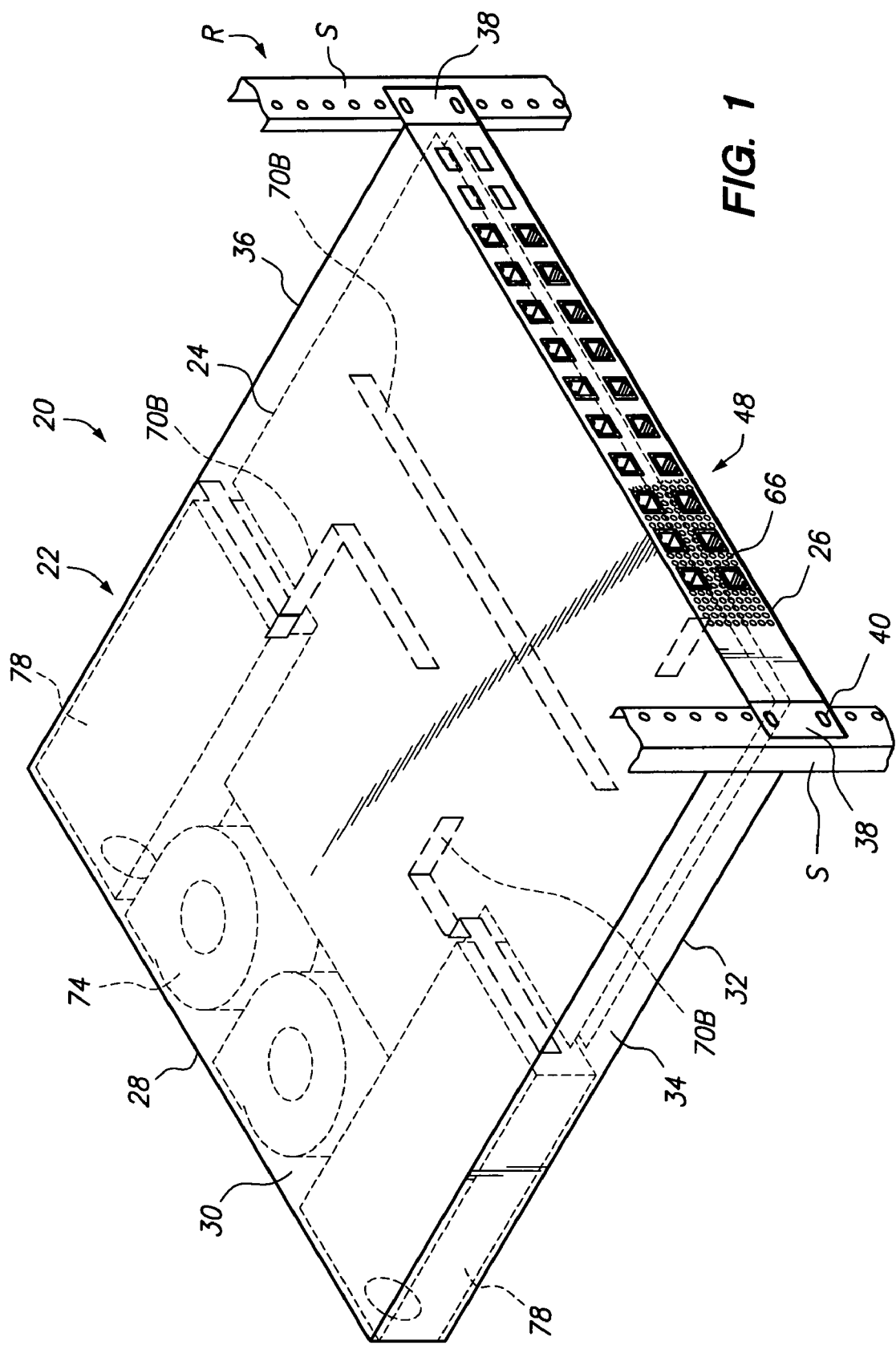
FIG. 1 is a perspective view of a chassis in accordance with the invention, the chassis supporting two communication boards in a configuration of one embodiment of the invention.

FIG. 1 illustrates a chassis 20 in accordance with one embodiment of the present invention. The chassis 20 comprises a housing 22 and one or more boards 24.

In one embodiment, the housing 22 comprises an enclosure for the one or more boards 24. As illustrated, the housing 22 has a front 26, a rear 28, a top 30, a bottom 32, and opposing first and second sides 34, 36. The housing 22 may be constructed of a variety of materials, and preferably of metal. So configured, the housing 22 defines a generally enclosed interior space for housing components, and preferably the one or more boards 24.

As detailed below, the chassis 20 is preferably configured for mounting to a component rack R. Such racks are known in the art, and generally comprise a standardized mounting. As illustrated, the rack R may comprise first and second spaced supports S. Preferably, the chassis 20 is configured to mount to the rack R, and in particular, the supports S. In this regard, the housing 20 defines a pair of outwardly extending mounts 38 at the front 26 thereof. Each mount 38 may include one or more apertures 40 for accepting a connector (not shown). The connectors are configured to connect the housing 22 to the supports S. Of course, the housing 22 might have other configurations depending upon the particular configuration of the rack R. It will also be appreciated that the dimensions of the housing 22 are selected so that the chassis 20 will fit into the rack R. In this regard, the configuration of the chassis 20 is constrained with respect to the configuration of the rack R.

Figure 2:
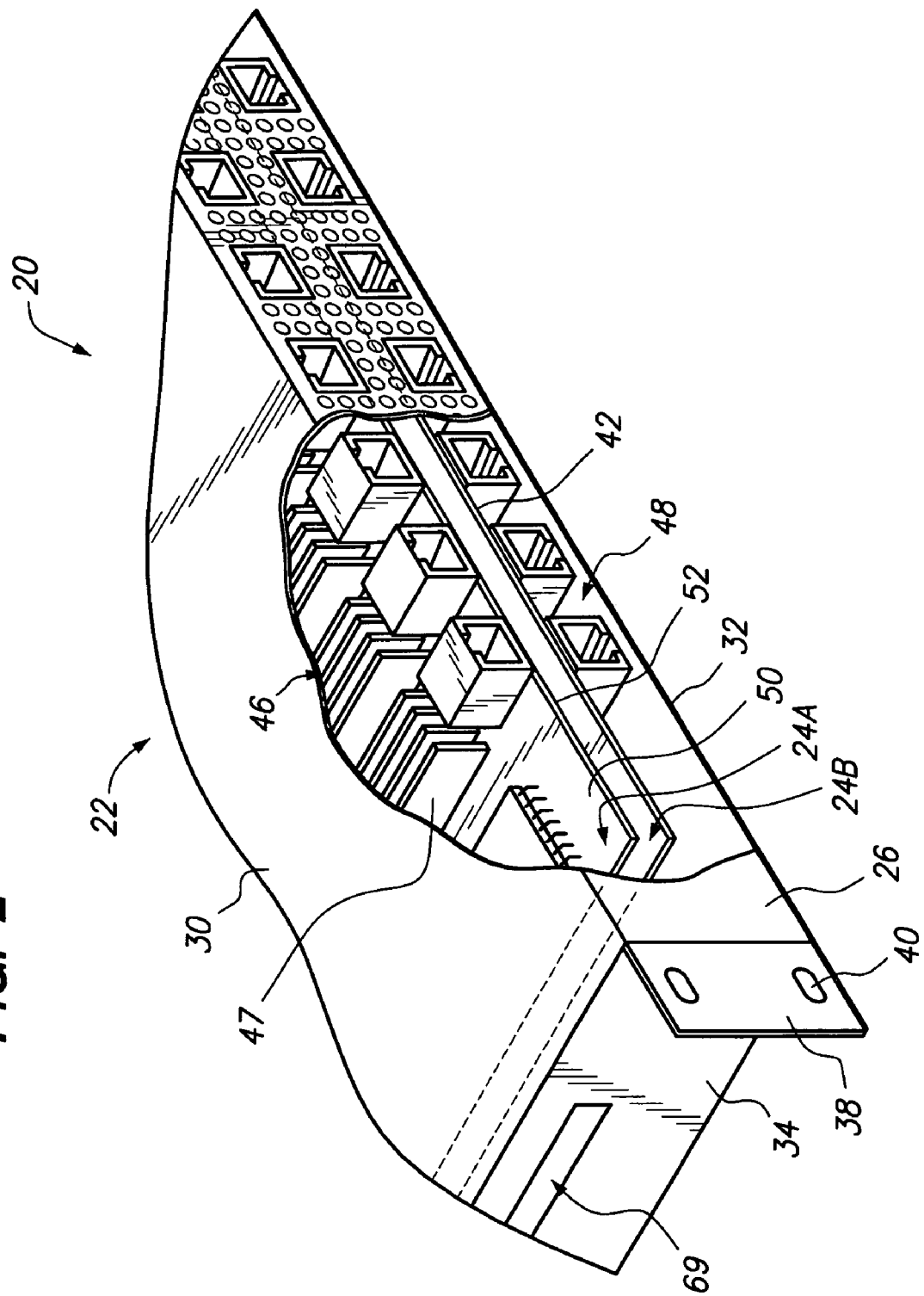
FIG. 2 is an enlarged view of the chassis illustrated in FIG. 1, shown partially cut away.

Referring now to FIG. 2, one embodiment of a configuration of the one or more boards to the housing is illustrated. As illustrated, a first board 24A and a second board 24B are located in the housing 22 of the chassis 20. The boards 24A, 24B may have a variety of configurations. In one embodiment, each board 24A, 24B has a substrate or base 42 with which a plurality of components 46 are associated (the components may be embedded in or mounted to the substrate 42, for example). As detailed below, in a preferred embodiment, the boards 24A, 24B are configured with hardware and/or software to act as data processing and switches systems. In other embodiments, the boards may be configured and operate in any manner. In order to dissipate heat, one or more heat sinks 47 may be mounted on each board 24A, 24B. Although shown with two boards 24A, 24B, in other embodiments any number of boards may be utilized, such as one or more than two.

The boards 24A, 24B also preferably each have a plurality of data ports 48. One or more data port 48 is configured to accept a connector, such as a connector of a data cable, as described in greater detail below. These ports 48 permit data to be transferred to and from each board 24A, 24B. In one embodiment, the data may also be exchanged between the boards 24A, 24B, such as by means of another connector or connectors between the boards, such as a mezzanine connector 54 between the boards (see FIG. 5)

The substrate or base 42 of each board 24A, 24B is preferably generally planar and has a first side 50 and an opposing second side 52. In one embodiment, the components 46, including the ports 48, are mounted to a first side of each board 24A, 24B.

In one embodiment of the invention, the boards 24A, 24B are spaced from one another and the housing 22. In this manner, as described in greater detail below, an air flow path is defined over the first and second sides 50, 52 of each board 24A, 24B. Referring to FIG. 2, the first board 24A is located inward of the top 30 of the housing 22. The second board 24B is located inward of the bottom 32 of the housing 22. Further, the first and second boards 24A, 24B are spaced from one another. The spacing is dependant on various design criteria including height of the components on the boards 24A, 24B and cooling requirements.

In one embodiment, the orientation of the boards 24A, 24B is reversed. In particular, the second sides 52 of the boards 24A, 24B face one another. However, the boards 24A, 24B could both be oriented in the same direction and still have the desired spacing relative to one another and the housing 22.

Figure 3:
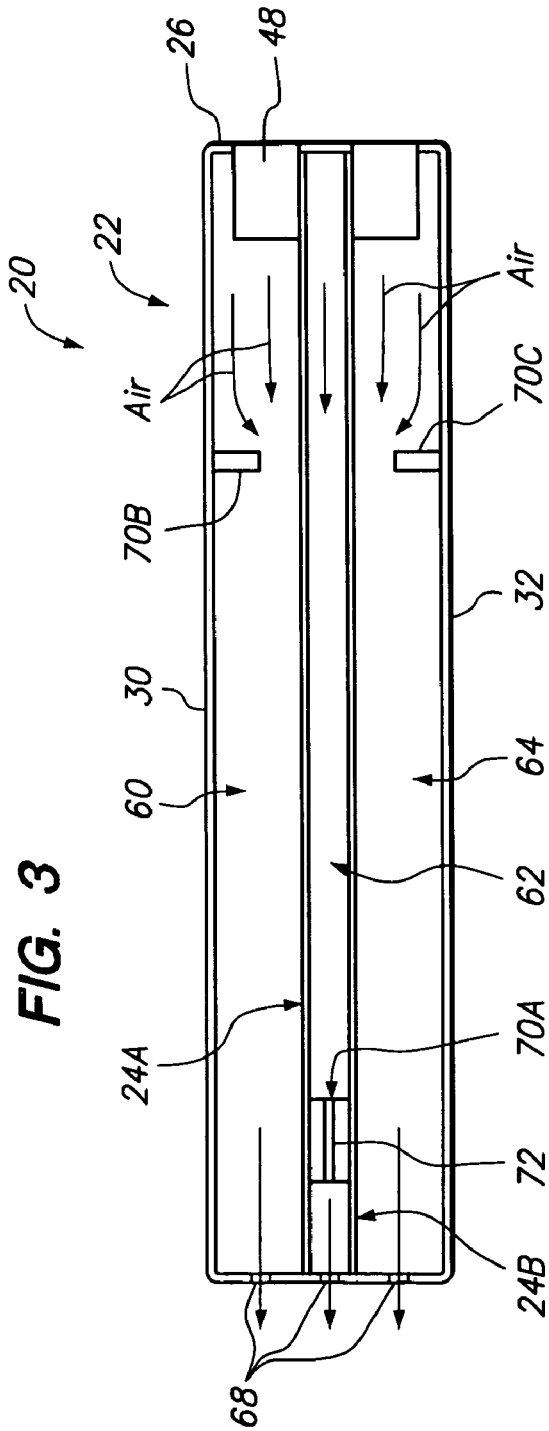
FIG. 3 is a cross-sectional side view of a chassis in accordance with an embodiment of the invention.

Referring to FIG. 3, in accordance with this configuration, a first space 60 is defined above the first board 24A. In the embodiment illustrated, this first space 60 is thus located between the first board 24A and the top 30 of the housing 22. A second space 62 is defined below the first board 24A and above the second 24B. A third space 64 is defined below the second board 24B. In the embodiment illustrated, this third space 64 is thus located between the second board 24B and the bottom 32 of the housing 22.

Figure 5:
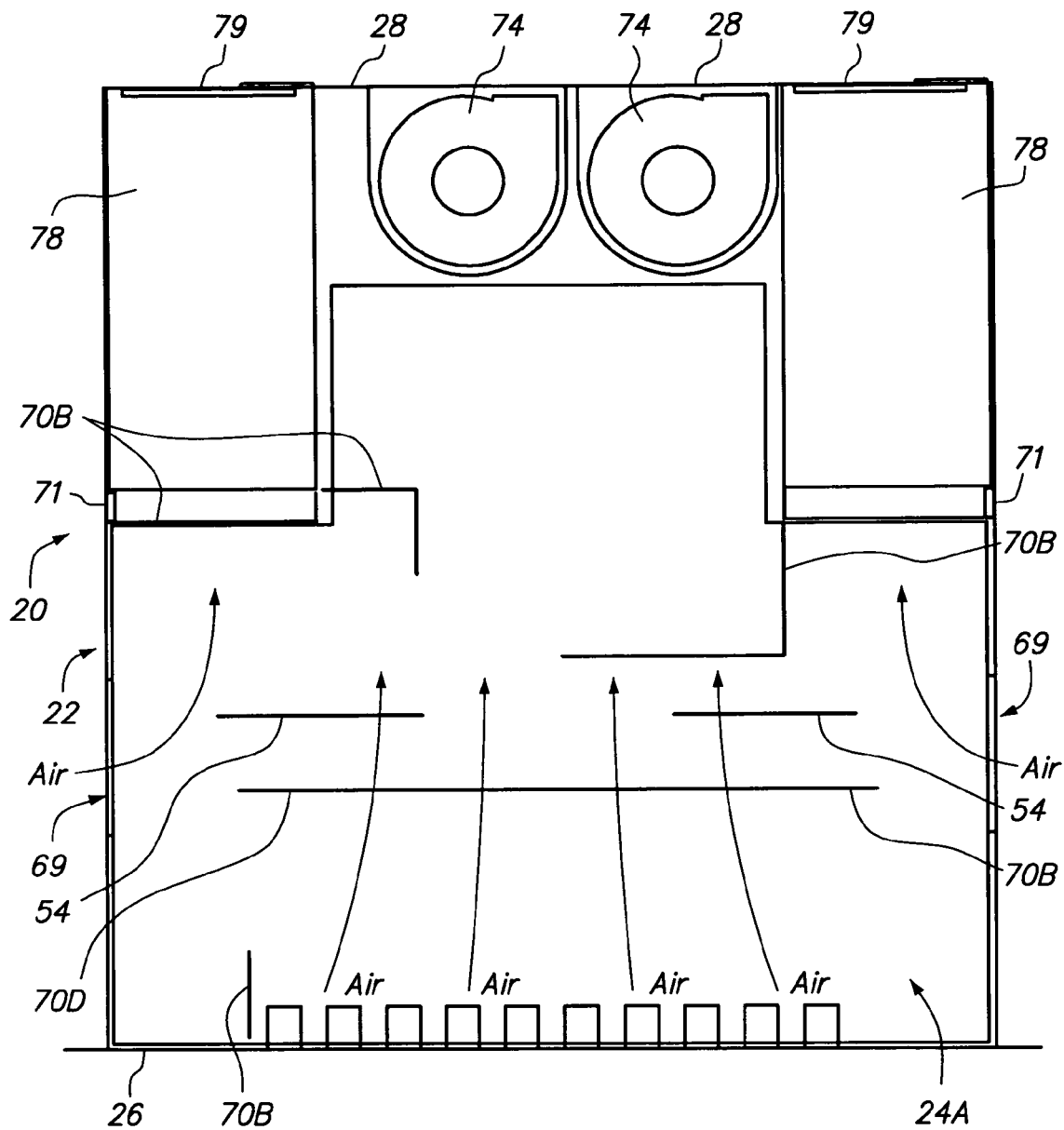
FIG. 5 is a top view of the chassis illustrated in FIG. 1 viewed through a top of a housing thereof.

In one embodiment, each of the first space 60, second space 62 and third space 64 comprise air spaces and air flow pathways. In one embodiment, at least one air intake or inlet is in communication with each air space. As best illustrated in FIG. 1, in one embodiment, a plurality of primary air vents or intakes 66 are provided in the front 26 of the housing 22. One or more of these vents 66 are in communication with each of the air spaces 60, 62, 64. As illustrated, these vents 66 may comprise one or more apertures located in the front 26 of the housing 20, such as a plurality of small apertures located between the ports 48. As illustrated in FIG. 5, one or more air intakes 69 may also be provided at the side of the housing 22 to provide additional air to the interior of the housing.

In addition, at least one air exhaust or outlet 68 is in communication with the air spaces 60, 62, 64, as illustrated in FIG. 3. As illustrated, in FIG. 4, two outlets 68 are provided, each outlet comprising a plurality of openings or apertures in the rear 30 of the housing 28.

In this manner, as described in greater detail below, cooling air may be routed through the housing 20 and around the boards 24A, 24B in order to dissipate heat from them. In one embodiment, air may be forced into the air vents 66 and/or drawn through the one or more air exhausts 68 (see FIG. 4) in order to facilitate air flow through the housing 22. Such may be accomplished with one or more blowers 74 (see FIGS. 1, 5 and 6) or other air handling or moving devices, as detailed below.

It will be appreciated that the principle of providing an air flow space on each side of the board may be applied to chassis 20 having as few as one board 24 or more than two boards. For example, if the chassis 20 had a single board 24, the board would preferably be oriented so that an air space was defined on both sides thereof, and the housing 22 configured so that an air flow path was defined through the housing 22 and those two air spaces. Likewise, the chassis 20 might include three boards 24 (or more). In such instance, there would preferably be four air spaces and corresponding air flow paths.

It will be appreciated that the boards 24 might be mounted to the housing 22 in various manners in order to space the boards from one another and the housing 22. In one embodiment, each board 24 is spaced from the housing and one another by a minimum distance of 3-26 mm, and most preferably about 6 mm.

In one embodiment, one or more baffles may be provided in the air spaces for controlling the flow of air there through. In one preferred embodiment, as best illustrated in FIG. 3, one or more baffles 70A are provided in the second space 62 between the two boards 24A, 24B. The one or more baffles 70A are configured to reduce the flow of air through the second space 62. The air flow resistance created by the one or more baffles 70A causes air being forced into or drawn through the housing 20 to follow the paths of lesser resistance, namely through the first and third spaces 60, 64. This configuration is particularly advantageous when considering the orientation of the boards 24A, 24B as illustrated. In particular, in the illustrated orientation, the majority of the components 46 associated with the first board 24A are located on the side of that board facing the first space 60. On the other hand, the majority of the components 46 associated with the second board 24B are located on the side of that board facing down into the third space 64. As a result, a greater amount of heat is generated in the first and third air spaces 60, 64. On the other hand, a lesser amount of heat is generated on the opposing sides of those boards 24A, 24B in the second space 62. By dividing the air flow through the housing 22 so that a larger amount of air flows through the first and second air spaces 60, 64, relative cooling between the first, second and third spaces 60, 62, 64 can be effected.

There may be as few as one baffle 70A or several. Preferably, the one or more baffles 70A do not entirely block the air flow path through an air flow space from the one or more inlets to the one or more outlets thereof. For example, multiple baffles 70A might be spaced apart, thus defining air flow openings there between. In one embodiment, the one or more baffles 70A may have one or more apertures 72 there through. The size and number of these apertures 72 may be used to "tune" the flow of air through the second space 62. In this manner, air flow and the rate of flow is selectively controlled to increase cooling to components which generate heat, while air flow may be diverted away from portions of the board which do not generate heat.

Referring to FIGS. 1 and 5, in one embodiment, one or more baffles 70B may be provided in the first air space 60. These baffles 70B may preferably be utilized to direct the air flowing through that space 60. One or more of these baffles 70B may be used to direct air downwardly towards the top board 24A, such to cool particular components in that area of the board, and/or to route or direct air flow, as best illustrated in FIG. 3. Referring to FIG. 5, a longitudinal baffle 70B may extend over the top board 24A near the front 22 of the chassis 20 for directing incoming air downwardly onto that board 24A. Other of the baffles 70B may be utilized to segregate air being drawn through the front 26 of the housing 20 from air flowing through side or secondary vents or intakes 69 (described below) leading to one or more power supplies 78 (also described below).

In one embodiment, the one or more baffles 70B may be mounted to or comprise a portion of the top 30 of the housing 22.

Figure 6:
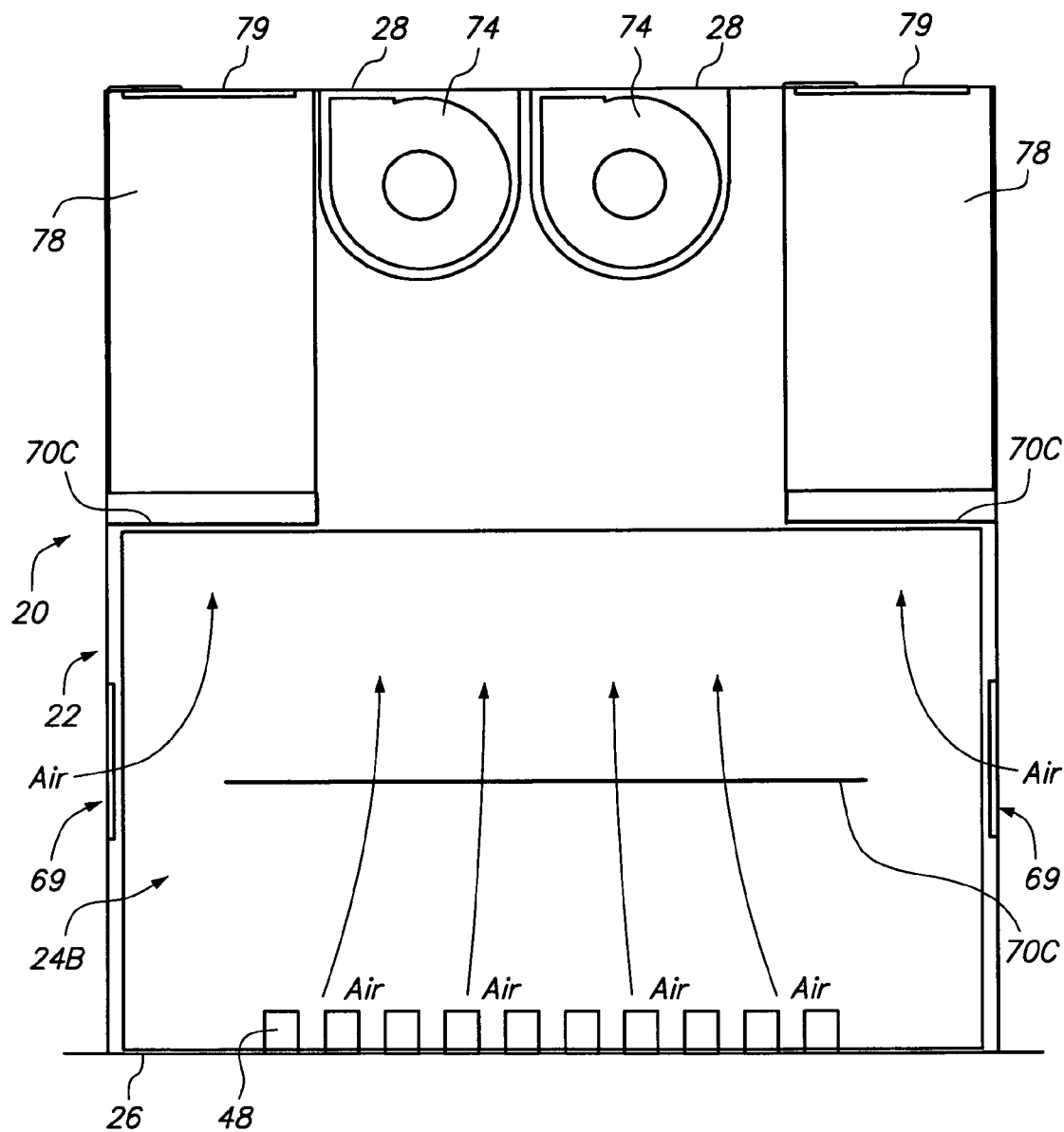
FIG. 6 is a bottom view of the chassis illustrated in FIG. 1 viewed through a bottom of a housing thereof.

Similarly, one or more baffles 70C may be provided in the third air space 64, as best illustrated in FIGS. 3 and 6. These baffles 70C may preferably be utilized to direct the air flowing through that space 64. One or more baffles 70C may be used to direct air upwardly towards the bottom board 24B and/or route or direct air flow. In one embodiment, the one or more baffles 70C may be mounted to or comprise a portion of the bottom 32 of the housing 22.

The various baffles may have various configurations. In one embodiment, the baffles may be removable, and they may be constructed of a variety of materials. In one embodiment, the baffles may comprise a spacer and/or mount between the two boards 24A, 24B, such as when the boards are configured in a mezzanine configuration as detailed below.

Figure 4:
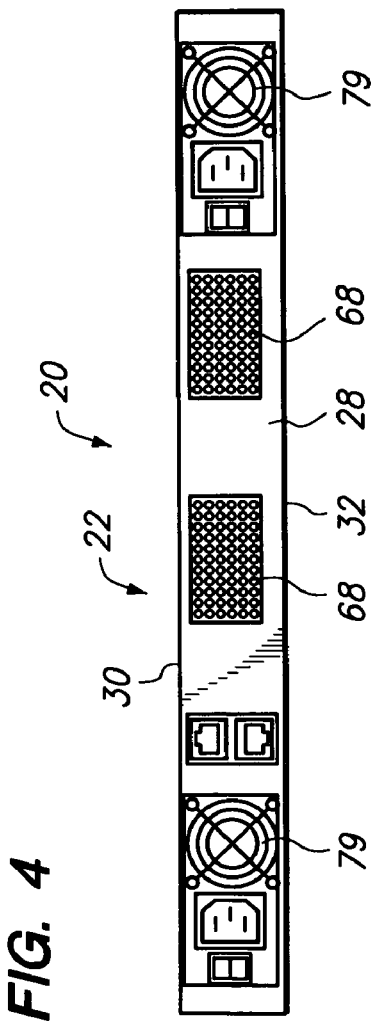
FIG. 4 is a plan rear view of the chassis illustrated in FIG. 1.

Referring to FIG. 4, in one embodiment, a plurality of exhaust vents or ports 68 are provided in the rear 28 of the housing 28. There may be as few as one, or two or more vents 68. Referring to FIG. 5, in one embodiment, one or more blowers 74 are located inside of the housing 22 and adjacent the exhaust vents 68. The blowers 74 are preferably configured to draw air into the housing 22 through the intake vents 66 and exhaust air through the exhaust vents 68. In one embodiment, two blowers 74 are provided. In order to provide sufficient air flow, in one embodiment, each blower 74 is configured to move 34-35 cubic feet of air per minute (cfm). As illustrated, the blowers 74 may be generally centrally located at the rear 28 of the housing 22, thus located to draw air centrally over the main or central portion of each board 24A, 24B.

In one embodiment, the chassis 20 includes at least one power supply for powering the components thereof, namely the boards 24A, 24B. In one embodiment, the chassis 20 includes two power supplies 78. As illustrated in FIGS. 1, 4 and 5 these power supplies 78 may be located at the rear 28 of the housing 22, at opposing sides 34, 36 thereof. Each power supply 78 may be configured with its own cooling system, namely a fan or blower (not shown). These fans may be configured to exhaust air through corresponding power supply exhaust vents 79 located at the rear 28 of the housing 22.

In order to provide segregated cooling air for the power supplies 78, air may be supplied through vents 71 other than the main intake vents 66. In particular, referring to FIGS. 2, 5 and 6, one or more side vents 71 located near a front of each power supply. Air may be drawn into the side vents 71 at each side of the housing 22 and be routed to the corresponding power supply 78 located at that same side of the housing 22. As indicated above, in one embodiment, one or more baffles may be provided in the interior of the housing 22 to at least partially segregate the air being drawn through the housing 22 by the blowers 74 which is used primarily to cool the boards 24A, 24B from the air drawn by the power supplies 78 (see FIGS. 1, 5 and 6 and baffles 70B, 70C).

Another embodiment of the invention will be described with reference to FIG. 7. In the description and illustration of this embodiment of the invention, like reference numbers have been used for like elements to those of the embodiment described above and illustrated in FIGS. 1-6, except that the reference numbers have been assigned "100" series designations.

As illustrated in FIG. 7, the one or more boards 124 of the chassis 120 may be provided with one or more non-linear edges. Each board 124 may have a front edge 180. In one embodiment, at least one portion of the front edge 180 is offset, such as by being set back from, one or more other portions thereof. As illustrated, each board 124 has a front edge 180 having one or more forward portions 182, and one or more recessed or set-back portions or "notches" 184. In a preferred embodiment, the forward portions 182 correspond to locations of ports 148. The set-back portions 184 comprise the other areas of the front edge 180, i.e. the areas on either side of the ports 148 (including the areas between the ports 148).

In one embodiment, the board 124 is configured or arranged relative to the housing 122 of the chassis 120 so that the forward portions 182 of the front edge 180 is located adjacent the front 126 of the housing 122. In this same manner, the set-back portions 184 are thus set back or spaced from the front 126 of the housing 122.

In this manner, as detailed below, air which flows through the vents 166 into the housing 122 can separate inside the housing 22. This permits maximum air to flow into the housing 22 and to then be divided or distributed as controlled by the various other configurations of the chassis 20 (including the baffles), versus having the amount of air which is permitted to flow to the particular areas be controlled by the volume of air which can be drawn from the outside of the chassis 20 into that particular first, second, or third area.

It will be appreciated that the orientation of the one or more boards 124 relative to the housing 122 may vary depending on the configuration of the chassis 120. In particular, the non-linear edge of the board 124 is preferably located at the portion of the housing 122 defining the one or more air inlets. In a configuration in which the air inlets are located at a rear of the housing 122, the non-linear edge of the board 124 is preferably located at least at the rear of board 124.

The total area of the offset or set-back portions may vary, such as to control the volume and speed of the air which is routed to each air flow space (such as depending on the cooling needs for each board). Moreover, the area of the set-backs on each of the two or more boards 24A, 24B may vary. For example, in one embodiment, the set-back area is greater for the top board 24A than the bottom board 24B, such as by increasing the set-back depth. However, other configures are possible (such a configuration is preferred when the top board 24A comprises a main board and the bottom board 24B comprises a mezzanine board in an embodiment as detailed below). In one embodiment, the offset or set-back areas are about 5-10 mm, and preferably about 8 mm, in width, and range in depth from 10-20 mm, and most preferably about 19 mm for the top board and 12 mm for the bottom board.

Yet another embodiment of the invention will be described with reference to FIG. 8. In the description and illustration of this embodiment of the invention, like reference numbers have been used for like elements to those of the embodiments described above, except that the reference numbers have been assigned "200" series designations.

In accordance with one embodiment of the invention, a chassis 220 has a plurality of ports. The ports may be associated with one or more boards, such as in the preferred configuration detailed above and illustrated in FIGS. 1-7. The ports may have a variety of configurations, but are preferably configured to accept at least one connector C. In one configuration, the ports are configured to accept RJ-45A connectors, those connectors C having a body B with a locking tab T at one side thereof. These connectors C are well known in the art.

In accordance with the invention, at least two ports 248A, 248B are located in general vertical alignment with one another. As illustrated, each port 248A, 248B has a top portion and a bottom portion. In one embodiment, the two ports 248A, 248B are located no more than about 11-12 mm apart (from their nearest portions in the vertical direction). In other embodiment, other distances may be configured. It will be appreciated that such a vertical arrangement is particularly suitable when the ports are associated with two (or more) boards arranged vertically above/below one another, as illustrated in FIG. 8. It will also be appreciated that in such a configuration, multiple sets of ports may be arranged in the vertical orientation as described.

In a preferred configuration of the invention, the ports 248A, 248B are arranged to be in inverse positions relative to one another. In particular, in the embodiment illustrated, the ports 248A, 248B are asymmetrical in configuration. In an embodiment where the ports 248A, 248B are configured to accept RJ-45A connectors, each port 248A, 248B has a main portion for accepting the body B of the connector C, and a slot for accepting at least a portion of the tab T of the connector C. Preferably, the ports 248A, 248B are arranged so that the top port 248A has its tab-engaging slot facing upwardly (i.e. located at a top of the port), and so that the bottom port 248B has its tab-engaging slot facing downwardly.

The orientation of the ports 248A, 248B as described has numerous benefits. Among the benefits is that when connectors C are engaged with the ports 248A, 248B, the tab T of each connector C faces away from the adjacent connector C. In particular, the tab T of the connector C which engages the top port 248A faces upwardly, away from the bottom port 248B and any associated connector C. Likewise, the tab T of the connector C which engages the bottom port 248B faces downwardly, away from the top port 248A and any associated connector C. In this configuration, the tabs T of the connectors C are easily accessible by a user and each tap does not interfere or touch the tap of the opposing connector. This configuration also allows the ports 248A, 248B to be placed much closer vertically than would otherwise normally be possible. In particular, in the configuration of the prior art in which the ports are arranged in the same direction (where the tab-engaging slot faces up), the two ports must be separated by a wide distance in order to allow the bottom port and connector to be accessible (since the tab of that connector will generally be shielded by the connector engaging the top port). Because the ports can be arranged closer to one another, the corresponding boards or other components can be located closer together as well, allowing the chassis to have a more compact profile (in the vertical direction).

Various functions, features and advantages of the invention will now be described.

Referring to FIG. 3, because air flow spaces 60, 62, 64 are provided above and below each of the boards 24A, 24B, cooling air is permitted to flow over both the top and bottom of each board 24A, 24B. Air is drawn into the housing 22 through the air intakes or vents 66. As illustrated, this air flows over the top of the top board 24A, between the top and bottom boards 24A, 24B, and below the bottom board 24B. As indicated, the air is drawn through the housing 22 via one or more blowers 74 (see FIG. 1), with the air exhausted from the housing 22 through the exhaust vents 68 (see FIG. 4).

The flow of air is manipulated by the various features of the invention. First, the one or more baffles 70A between the top and bottom boards 24A, 24B limits the flow of air through the second air space 62. This increases the flow of air through the first and third air spaces 64, 66.

Second, the one or more baffles 70B, 70C associated with the top 30 and bottom 32 of the housing 22 work to redirect air towards the top and bottom boards 24A, 24B. In this manner, the air drawn through the housing 22 is ensured to flow directly over the boards 24A, 24B, including the components thereof, such as to direct air to components which require greater cooling.

As indicated, the air flows for cooling the boards 24A, 24B and the power supplies 78 is also tuned or controlled so that most effective cooling is accomplished. In particular, the board cooling air flow is somewhat segregated from the cooling air flow for the power supplies 78, so that the power supply fans and cooling system works efficiently and is not interfered with by the board cooling air flow.

In addition, referring to FIG. 7, the flow of air through the housing 122 and around the top and bottom boards 124A, 124B is tuned or manipulated by the non-linear or "notched" configuration of the top and bottom boards 124A, 124B. In particular, if the boards 124A, 124B were not notched and extended to the front 126 of the housing 122, the air drawn into each of three air spaces would be entirely segregated and the amount of air flow reaching these areas would be controlled by how much air can flow through the front 26 of the housing to those areas. However, the notches allow a maximum amount of air to be drawn first into the housing 120, and to then be directed or divided to flow to the desired areas in the desired amounts or proportions. The notches may also be configured to baffles.

In one embodiment, as detailed, air is also drawn into the housing 22 for use in cooling the power supplies 78. Referring to FIG. 5, this cooling air may flow through the side vents 69 and then through the housing to the power supplies 78. The air is then exhausted from the housing 22 through the power supply air exhausts 79.

In a preferred embodiment, as illustrated in FIGS. 1, 5 and 6, the air which is drawn through the housing 22 and routed around the boards 24A, 24B is segregated in one or more respects from the air which is drawn through the housing 22 for use in cooling the power supplies 78. As indicated, one or more baffles or other elements may be utilized in order to at least partially divide or segregate these air flows.

As another aspect of the invention, as illustrated in FIG. 8, ports 248A, 248B are arranged in an inverse or opposing orientation. As indicated, this allows the ports 248A, 248B to be located closer together and still provide convenient access to connectors C associated therewith. Vents 266 which allow air flow are also provided in the embodiment shown in FIG. 8.

A variety of other configurations of the invention are contemplated. For example, the power supplies and their location and cooling configuration may vary. For example, air might also be drawn through the front of the housing for cooling the power supplies. The power supplies might also not include their own cooling feature, in which case the air which is used to cool the boards might also be used to cool the one or more power supplies. There might also be provided more than one intake vent for each power supply, and the location of the one or more vents might vary.

The location and number of the baffles, vents, blowers and other features of the chassis may vary, including depending upon the configuration of the boards. In general, the cooling features are configured to direct maximum air flow over the portions or areas of the boards which generate the most heat (such as at the location of chips and in the location of the heat sinks). If the location of these board features change, then the location of the baffles and blowers might change, for example, to maximize air flow over other regions of the board. In the embodiment illustrated, the primary areas of heat generation or heat dissipation at the boards is located towards the middle thereof (in relation to the sides of the housing). As a result, the blowers are located generally centrally between the sides of the housing, thus maximizing the air flow directly over the hottest areas of the boards.

The configurations of the boards may vary. In one embodiment, the boards may have different configurations. As illustrated in FIG. 5, in one embodiment, the top board 24A has a "T" shape, having a rear portion that is narrower than a front portion. The rear portion of the top board 24A extends between the power supplies 78 to the blowers 74. On the other hand, as illustrated in FIG. 6, the bottom board 24B has a rectangular configuration, extending from the front of the housing 20 to a point forward of the power supplies 78.

As indicated, the principles of the invention may be applied in a wide variety of applications. In one embodiment of the invention, referring to FIG. 2, the top and bottom boards 24A, 24B comprise a base and mezzanine board communicatively linked. In a preferred embodiment of the invention, the base board actually comprises the top board 24A, while the mezzanine board actually comprises the bottom board 24B (i.e. the mezzanine board comprises a "basement" board). In one embodiment, two mezzanine connectors carrying six (6) XAUI ports each connect the bottom board 24B to the top board 24A.

Referring to FIG. 1, in a preferred embodiment, the chassis 20 supports twenty-four (24) ports 48. In one embodiment, ten (10) 10 GBASE-T ports are distributed on each of the top and bottom boards 24A, 24B. Each board 24A, 24B also has two (2) XFP (optical) ports. In one embodiment, both boards act as switches, permitting any port 48 to pass data to any other port 48.

In one embodiment, the chassis utilizes as much as 500 W DC/750 W AC. As a result of the constraints on the size of the chassis to fit a standard rack R, conventional cooling techniques and configurations were found ineffective. As indicated above, a plurality of cooling configurations or features have been found beneficial in overcoming such inadequate cooling issues.

It will be understood that the above described arrangements of apparatus and the method there from are merely illustrative of applications of the principles of this invention and many other embodiments and modifications may be made without departing from the spirit and scope of the invention as defined in the claims.

What is claimed is:

1. A cooling configuration for chassis-mounted electronics boards, comprising:
   a housing, said housing having a top, a bottom, a front and a rear and defining a generally enclosed interior space;
   a first electronics board, the first electronics board comprising: one or more ports, a first side and a second side, a front edge and a plurality of notches extending rearwardly into said first electronics board from said front edge;
   a second electronics board, the second electronics board comprising: one or more ports, a first side and a second side, a front edge and a plurality of notches extending rearwardly into said second electronics board from said front edge;
   at least two cooling air spaces adjacent a combination of said first and second electronics boards;
   at least one cooling air intake in said housing, said front edge of said first electronics board and said front edge of said second electronics board located adjacent at least one of said cooling air intakes; and
   at least one air exhaust in said housing in communication with said at least two cooling air spaces;
   whereby cooling air which flows into said housing through said at least one cooling air intake is distributed at least in part by said notches in said first and second electronics boards to said at least two cooling air spaces, flows through said cooling air spaces and exhausts out of said housing through said at least one air exhaust;
   wherein said at least one cooling air intake is located at said front of said housing and said at least one air exhaust is located at said rear of said housing and wherein said front edges of said first and second electronics boards are located at said front of said housing.

2. The cooling configuration in accordance with claim 1 wherein said first electronics board is mounted above said second electronics board, a first cooling air space is between said first electronics board and said top of said housing, a second cooling air space is between said first and second electronics boards, and a third cooling air space is between said second electronics board and said bottom of said housing.

3. The cooling configuration in accordance with claim 1 wherein an area of the notches of said first electronics board is greater than an area of the notches of said second electronics board.

4. The cooling configuration in accordance with claim 1 wherein said notches of said first and second electronics boards are located between said ports of said electronics boards.

5. The cooling configuration in accordance with claim 1 wherein said notches of said first electronics board have a first width and first depth and said notches of said second electronics board have a second width and a second depth.

6. The cooling configuration in accordance with claim 5 wherein said first width exceeds said second width and said first depth exceeds said second depth.

7. The cooling configuration in accordance with claim 1 further including at least one air moving device located in said housing and configured to move air through said at least one board air intake to said at least one board air exhaust.

8. The cooling configuration in accordance with claim 1 including at least one power supply, at least one power supply air intake located in said housing and at least one power supply air exhaust located in said housing.

9. The cooling configuration in accordance with claim 1 wherein said housing is configured for mounting to a standard electronics component rack.

10. The cooling configuration in accordance with claim 1 wherein components are located on said first side of said first electronics board and components are located at said second side of said second electronics board, said first and second electronics boards arranged in said housing such that said second side of said first electronics board and said first side of said second electronics board face one another.

11. A cooling configuration for a chassis-mounted electronics board, comprising:
- a housing, said housing having a top, a bottom, a front and a rear and defining a generally enclosed interior space;
- at least one electronics board having one or more ports, a first side and a second side, a front edge and a plurality of notches extending rearwardly into said board from said front edge;
- a first cooling air space at said first side of said electronics board and a second cooling air space at said second side of said electronics board;
- at least one cooling air intake in said housing, said front edge of said at least one electronics board located adjacent at least one of said cooling air intakes; and
- at least one air exhaust in said housing in communication with said first and second cooling air spaces;
- whereby cooling air which flows into said housing through said at least one cooling air intake is distributed at least in part by said notches in said at least one electronics board to said at first and second cooling air spaces, flows through said cooling air spaces and exhausts out of said housing through said at least one air exhaust;
- wherein one or more cooling air intakes are located at said front of said housing and said front edge of said at least one electronics board is located at said front of said housing.

12. The cooling configuration in accordance with claim 11 wherein said notches in said at least one electronics board are located between said ports thereof.

13. The cooling configuration in accordance with claim 11 wherein said notches in said at least one electronics board provides air flow passages between said first and second cooling air spaces.

14. The cooling configuration in accordance with claim 11 further comprising a plurality of electronics boards, each board having a plurality of notches.

* * * * *